(12) United States Patent
Poo et al.

(10) Patent No.: US 8,115,306 B2
(45) Date of Patent: Feb. 14, 2012

(54) APPARATUS AND METHOD FOR PACKAGING CIRCUITS

(75) Inventors: Chia Yong Poo, Singapore (SG); Boon Suan Jeung, Singapore (SG); Low Siu Waf, Signapore (SG); Chan Min Yu, Singapore (SG); Neo Yong Lou, Singapore (SG); Eng Meow Koon, Singapore (SG); Ser Bok Leng, Singapore (SG); Chun Swee Kwang, Singapore (SG); So Chee Chung, Singapore (SG); Ho Kwok Song, Singapore (SG)

(73) Assignee: Round Rock Research, LLC, Mt. Kisco, NY (US)

( * ) Notice: Subject to any disclaimer, the term of this patent is extended or adjusted under 35 U.S.C. 154(b) by 0 days.

(21) Appl. No.: 12/705,277

(22) Filed: Feb. 12, 2010

(65) Prior Publication Data

US 2010/0140794 A1    Jun. 10, 2010

Related U.S. Application Data

(60) Continuation of application No. 11/934,556, filed on Nov. 2, 2007, now Pat. No. 7,675,169, which is a division of application No. 11/281,084, filed on Nov. 17, 2005, now Pat. No. 7,358,154, which is a division of application No. 10/929,932, filed on Aug. 30, 2004, which is a division of application No. 10/118,576, filed on Apr. 8, 2002, now Pat. No. 6,894,386.

(30) Foreign Application Priority Data

Oct. 8, 2001 (SG) .............................. 200106182-9

(51) Int. Cl.
*H01L 23/48* (2006.01)

(52) U.S. Cl. ........ 257/734; 257/723; 257/735; 257/773; 257/776; 257/780; 257/781; 257/E23.17; 257/E21.507

(58) Field of Classification Search .................. 257/730, 257/734–786, E23.01–E23.079, E23.141–E23.179, 257/690, 693; 361/600, 679.01, 820
See application file for complete search history.

(56) References Cited

U.S. PATENT DOCUMENTS 3,617,938 A    11/1971   Denes et al.
(Continued)

FOREIGN PATENT DOCUMENTS

CA           2330426        11/1998
(Continued)

OTHER PUBLICATIONS

"Search Report for Singapore Patent Application No. 200302511-1", (May 12, 2005), 17 pgs.

(Continued)

*Primary Examiner* — Jasmine J Clark
(74) *Attorney, Agent, or Firm* — Lerner, David, Littenberg, Krumholz & Mentlik, LLP

(57) ABSTRACT

An apparatus comprises an integrated circuit die including a main body having a top layer, a bottom layer, and a peripheral edge surface extending between the top layer and the bottom layer. The integrated circuit die also includes a bond pad on the main body, an edge contact at the peripheral edge surface and a line connecting the bond pad to the edge contact. The edge contact includes a bottom surface that substantially in the same plane as a surface of an encapsulant encasing the die. Additional apparatus, systems, and methods are disclosed.

20 Claims, 11 Drawing Sheets

U.S. PATENT DOCUMENTS

| | | | |
|---|---|---|---|
| 3,691,707 A | 9/1972 | Von Arx et al. |
| 3,735,214 A | 5/1973 | Renskers et al. |
| 3,991,296 A | 11/1976 | Kojima et al. |
| 4,085,038 A | 4/1978 | Esseluhn |
| 4,141,456 A | 2/1979 | Hart |
| 4,355,457 A | 10/1982 | Barlett et al. |
| 4,610,079 A | 9/1986 | Abe et al. |
| 4,668,032 A | 5/1987 | Bouvier et al. |
| 4,764,846 A | 8/1988 | Go |
| 4,811,722 A | 3/1989 | Brehm et al. |
| 4,871,418 A | 10/1989 | Wittlinger et al. |
| 4,896,459 A | 1/1990 | Brandt |
| 4,900,893 A | 2/1990 | Yamazaki et al. |
| 4,930,216 A | 6/1990 | Nelson |
| 4,961,821 A | 10/1990 | Drake et al. |
| 4,983,251 A | 1/1991 | Haisma et al. |
| 4,990,993 A | 2/1991 | Tsurumaru |
| 5,079,222 A | 1/1992 | Yamazaki |
| 5,081,049 A | 1/1992 | Green et al. |
| 5,086,407 A | 2/1992 | McGarity et al. |
| 5,091,331 A | 2/1992 | Delgado et al. |
| 5,107,586 A | 4/1992 | Eichelberger et al. |
| 5,126,286 A | 6/1992 | Chance et al. |
| 5,146,308 A | 9/1992 | Chance et al. |
| 5,166,097 A | 11/1992 | Tanielian |
| 5,185,295 A | 2/1993 | Goto et al. |
| 5,218,229 A | 6/1993 | Farnworth |
| 5,219,796 A | 6/1993 | Quinn et al. |
| 5,272,114 A | 12/1993 | van Berkum et al. |
| 5,294,381 A | 3/1994 | Iguchi et al. |
| 5,302,554 A | 4/1994 | Kashiwa et al. |
| 5,302,849 A | 4/1994 | Cavasin |
| 5,356,081 A | 10/1994 | Sellar |
| 5,500,503 A | 3/1996 | Pernicka et al. |
| 5,543,365 A | 8/1996 | Wills et al. |
| 5,552,345 A | 9/1996 | Schrantz et al. |
| 5,606,198 A | 2/1997 | Ono et al. |
| 5,648,684 A | 7/1997 | Bertin et al. |
| 5,661,901 A | 9/1997 | King |
| 5,663,105 A | 9/1997 | Sua et al. |
| 5,729,437 A | 3/1998 | Hashimoto |
| 5,737,192 A * | 4/1998 | Linderman | 361/790 |
| 5,780,806 A | 7/1998 | Ferguson et al. |
| 5,804,314 A | 9/1998 | Field et al. |
| 5,825,076 A | 10/1998 | Kotvas et al. |
| 5,846,375 A | 12/1998 | Gilchrist et al. |
| 5,852,624 A | 12/1998 | Matsuyama et al. |
| 5,856,937 A | 1/1999 | Chu et al. |
| 5,879,964 A | 3/1999 | Paik et al. |
| 5,888,884 A | 3/1999 | Wojnarowski |
| 5,902,499 A | 5/1999 | Richerzhagen |
| 5,904,546 A | 5/1999 | Wood et al. |
| 5,904,548 A | 5/1999 | Orcutt |
| 5,910,687 A | 6/1999 | Chen et al. |
| 5,925,934 A | 7/1999 | Lim |
| 5,952,611 A | 9/1999 | Eng et al. |
| 5,961,852 A | 10/1999 | Rafla-Yuan et al. |
| 5,990,566 A | 11/1999 | Farnworth et al. |
| 6,002,163 A | 12/1999 | Wojnarowski |
| 6,007,730 A | 12/1999 | Shiomi et al. |
| 6,008,069 A | 12/1999 | Yamada |
| 6,034,438 A * | 3/2000 | Petersen | 257/786 |
| 6,040,618 A | 3/2000 | Akram |
| 6,054,760 A | 4/2000 | Tovar et al. |
| 6,072,236 A | 6/2000 | Akram et al. |
| 6,075,710 A | 6/2000 | Lau |
| 6,083,218 A | 7/2000 | Chou |
| 6,084,175 A | 7/2000 | Perry et al. |
| 6,087,203 A | 7/2000 | Eng |
| 6,096,635 A | 8/2000 | Mou et al. |
| 6,130,401 A | 10/2000 | Yoo et al. |
| 6,133,065 A | 10/2000 | Akram |
| 6,137,164 A | 10/2000 | Yew et al. |
| 6,156,030 A | 12/2000 | Neev |
| 6,163,010 A | 12/2000 | Kobsa |
| 6,211,488 B1 | 4/2001 | Hoekstra et al. |
| 6,211,572 B1 | 4/2001 | Fjelstad et al. |
| 6,214,703 B1 | 4/2001 | Chen et al. |
| 6,221,751 B1 | 4/2001 | Chen et al. |
| 6,228,687 B1 | 5/2001 | Akram et al. |
| 6,236,107 B1 | 5/2001 | Chan et al. |
| 6,257,224 B1 | 7/2001 | Yoshino et al. |
| 6,271,060 B1 | 8/2001 | Zandman et al. |
| 6,271,542 B1 | 8/2001 | Emma et al. |
| 6,291,317 B1 | 9/2001 | Salatino et al. |
| 6,291,894 B1 | 9/2001 | Farnworth et al. |
| 6,294,837 B1 | 9/2001 | Akram et al. |
| 6,295,978 B1 | 10/2001 | Wark et al. |
| 6,319,354 B1 | 11/2001 | Farnworth et al. |
| 6,326,689 B1 | 12/2001 | Thomas |
| 6,365,833 B1 | 4/2002 | Eng et al. |
| 6,379,999 B1 | 4/2002 | Tanabe |
| 6,383,835 B1 | 5/2002 | Hata et al. |
| 6,387,729 B2 | 5/2002 | Eng et al. |
| 6,391,985 B1 | 5/2002 | Goode et al. |
| 6,393,685 B1 | 5/2002 | Collins |
| 6,414,374 B2 | 7/2002 | Farnworth et al. |
| 6,420,245 B1 | 7/2002 | Manor |
| 6,427,676 B2 | 8/2002 | Akram et al. |
| 6,462,399 B1 | 10/2002 | Akram |
| 6,483,180 B1 | 11/2002 | Bayan et al. |
| 6,521,995 B1 | 2/2003 | Akram et al. |
| 6,534,382 B1 | 3/2003 | Sakaguchi et al. |
| 6,555,294 B1 | 4/2003 | Albertini et al. |
| 6,555,447 B2 | 4/2003 | Weishauss et al. |
| 6,562,640 B1 | 5/2003 | Tseng et al. |
| 6,562,698 B2 | 5/2003 | Manor |
| 6,593,595 B2 | 7/2003 | Ono et al. |
| 6,611,052 B2 | 8/2003 | Poo et al. |
| 6,611,540 B1 | 8/2003 | Mueller |
| 6,624,505 B2 | 9/2003 | Badehi |
| 6,656,765 B1 | 12/2003 | DiCaprio |
| 6,669,801 B2 | 12/2003 | Yoshimura et al. |
| 6,677,675 B2 | 1/2004 | Bolken |
| 6,717,245 B1 | 4/2004 | Kinsman et al. |
| 6,733,711 B2 | 5/2004 | Durocher et al. |
| 6,735,231 B2 | 5/2004 | Ono |
| 6,743,696 B2 | 6/2004 | Jeung et al. |
| 6,750,547 B2 | 6/2004 | Jeung et al. |
| 6,805,808 B2 | 10/2004 | Fujii et al. |
| 6,836,009 B2 | 12/2004 | Koon et al. |
| 6,847,101 B2 * | 1/2005 | Fjelstad et al. | 257/668 |
| 6,894,386 B2 | 5/2005 | Poo et al. |
| 6,930,382 B2 | 8/2005 | Sawada et al. |
| 6,946,324 B1 | 9/2005 | McLellan et al. |
| 7,071,018 B2 | 7/2006 | Mason et al. |
| 7,198,969 B1 | 4/2007 | Khandros et al. |
| 7,342,320 B2 | 3/2008 | Hedler et al. |
| 7,358,154 B2 | 4/2008 | Poo et al. |
| 7,375,009 B2 | 5/2008 | Chua et al. |
| 2001/0030357 A1 | 10/2001 | Murata |
| 2001/0034564 A1 | 10/2001 | Jones |
| 2001/0040152 A1 | 11/2001 | Higashi et al. |
| 2001/0054606 A1 | 12/2001 | Weishauss et al. |
| 2002/0001882 A1 | 1/2002 | Eng et al. |
| 2002/0019069 A1 | 2/2002 | Wada |
| 2002/0031864 A1 | 3/2002 | Ball |
| 2002/0031899 A1 | 3/2002 | Manor |
| 2002/0046997 A1 | 4/2002 | Nam et al. |
| 2002/0086137 A1 | 7/2002 | Brouillette et al. |
| 2002/0089043 A1 | 7/2002 | Park et al. |
| 2002/0094607 A1 | 7/2002 | Gebauer et al. |
| 2002/0123213 A1 | 9/2002 | Williams |
| 2002/0139577 A1 | 10/2002 | Miller |
| 2002/0164838 A1 | 11/2002 | Moon et al. |
| 2002/0170896 A1 | 11/2002 | Choo et al. |
| 2002/0190435 A1 | 12/2002 | O'Brien et al. |
| 2003/0006795 A1 | 1/2003 | Asayama et al. |
| 2003/0052098 A1 | 3/2003 | Kim et al. |
| 2003/0060034 A1 | 3/2003 | Beyne et al. |
| 2003/0071335 A1 | 4/2003 | Jeung et al. |
| 2003/0071341 A1 | 4/2003 | Jeung et al. |
| 2003/0082845 A1 | 5/2003 | Hoffman et al. |
| 2003/0127428 A1 | 7/2003 | Fujii et al. |
| 2004/0026382 A1 | 2/2004 | Richerzhagen |
| 2004/0056008 A1 | 3/2004 | Choo et al. |
| 2004/0188400 A1 | 9/2004 | Peng et al. |

| | | | |
|---|---|---|---|
| 2005/0029668 | A1 | 2/2005 | Poo et al. |
| 2006/0084240 | A1 | 4/2006 | Poo et al. |
| 2008/0054423 | A1 | 3/2008 | Poo et al. |
| 2008/0211113 | A1 | 9/2008 | Chua et al. |

FOREIGN PATENT DOCUMENTS

| | | |
|---|---|---|
| EP | 689245 | 12/1995 |
| EP | 0689245 A2 | 12/1995 |
| EP | 0818818 | 1/1998 |
| EP | 1071126 A2 | 1/2001 |
| JP | 58-036939 | 3/1983 |
| JP | 59-097545 | 6/1984 |
| JP | 60127743 A2 | 7/1985 |
| JP | 62224515 A2 | 10/1987 |
| JP | 36-2046544 | 2/1990 |
| JP | 2001-026435 | 1/2001 |
| JP | 2002-170904 | 6/2002 |
| WO | WO-99/56907 | 11/1999 |
| WO | WO-00/75983 | 12/2000 |
| WO | WO-0075985 A1 | 12/2000 |
| WO | WO-01/75966 | 10/2001 |

OTHER PUBLICATIONS

U.S. Appl. No. 10/744,632 Final Office Action mailed Dec. 13, 2007, FOAR,11 pgs.
U.S. Appl. No. 10/232,267 Non-Final Office Action mailed Jul. 2, 2007, 9 Pgs.
U.S. Appl. No. 10/118,576 Amendment and Response filed Jan. 26, 2004 to Final office action mailed Nov. 28, 2003, 13 pgs.
U.S. Appl. No. 10/118,576 Final office action mailed Nov. 28, 2003, 24 pgs.
U.S. Appl. No. 10/118,576 Non-final office action mailed Mar. 1, 2004, 8 pgs.
U.S. Appl. No. 10/118,576 Non-final office action mailed Jun. 10, 2003, 23 pgs.
U.S. Appl. No. 10/118,576 Non-final office action mailed Aug. 16, 2004, 8 pgs.
U.S. Appl. No. 10/118,576 Notice of allowance mailed Jan. 6, 2005, 5 pgs.
U.S. Appl. No. 10/118,576 Response filed May 28, 2004 to Non-final office action mailed Mar. 1, 2004, 8 pgs.
U.S. Appl. No. 10/118,576 Response filed Sep. 10, 2003 to Non-final office action mailed Jun. 10, 2003, 20 pgs.
U.S. Appl. No. 10/118,576 Response filed Oct. 18, 2004 to Non-final office action mailed Aug. 16, 2004, 12 pgs.
U.S. Appl. No. 10/744,632 Final office action mailed Jan. 31, 2007, 11 pgs.
U.S. Appl. No. 10/744,632 Non-final office action mailed Jul. 2, 2007, 9 pgs.
U.S. Appl. No. 10/744,632 Non-final office action mailed Oct. 5, 2006, 15 pgs.
U.S. Appl. No. 10/744,632 Response filed Nov. 30, 2006 to Non-final office action mailed Oct. 5, 2006, 19 pgs.
U.S. Appl. No. 10/929,932 Non-Final Office Action mailed Oct. 18, 2007, 15 pgs.
U.S. Appl. No. 11/281,084 Non-final office action mailed Jan. 22, 2007, 16 pgs.
U.S. Appl. No. 11/281,084 Notice of allowance mailed 7-24-200, 7 pgs.
U.S. Appl. No. 11/281,084 Response filed Apr. 23, 2007 to Non-final office action mailed Jan. 22, 2007, 11 pgs.
U.S. Appl. No. 10/232,267 Non Final Office Action mailed Jun. 28, 2007., 8 pgs.
U.S. Appl. No. 10/232,267 Response filed Sep. 25, 2007 to Non Final Office Action mailed Jun. 28, 2007., 23 pgs.
U.S. Appl. No. 10/744,632, Response Filed Mar. 26, 2007 to Final Office Action mailed Jan. 31, 2007., 18 Pgs.
U.S. Appl. No. 10/744,632 Response filed Mar. 26, 2007 to Final Office Action mailed Jan. 31, 2007, 18 pgs.
U.S. Appl. No. 10/744,632, Response filed Oct. 2, 2007 to Non-Final Office Action mailed Jul. 2, 2007., 19 pgs.
U.S. Appl. No. 10/823,314 Final Office Action mailed Sep. 11, 2007, 9 pgs.
U.S. Appl. No. 11/281,084, Non-Final Office Action mailed Jan. 22, 2007, 16 pgs.
U.S. Appl. No. 11/281,084, Notice of Allowance mailed Jul. 24, 2007., NOAR,7 pgs.
U.S. Appl. No. 11/281,084, Notice of Allowance Mailed Nov. 29, 2007, 8.
U.S. Appl. No. 10/929,932, Notice of Allowance mailed Oct. 26, 2005, 7 pgs.
U.S. Appl. No. 10/929,932, Preliminary Amendment mailed Jan. 25, 2006,8 pgs.
U.S. Appl. No. 10/929,932, Non Final Office Action mailed Jun. 20, 2006, 11 pgs.
U.S. Appl. No. 10/929,932, Response filed Sep. 20, 2006 to Non Final Office Action mailed Jun. 20, 2006, 11 pgs.
U.S. Appl. No. 10/929,932, Final Office Action mailed Nov. 17, 2006, 11 pgs.
U.S. Appl. No. 10/929,932, Response filed Jan. 17, 2007 to Final Office Action mailed Nov. 17, 2006, 10 pgs.
U.S. Appl. No. 10/929,932, Advisory Action mailed Feb. 1, 2007,3 pgs.
U.S. Appl. No. 10/929,932, Notice of Allowance mailed Apr. 9, 2007, 8 pgs.
U.S. Appl. No. 10/929,932 Non Final Office Action mailed Oct. 18, 2007, 15 pgs.
U.S. Appl. No. 10/929,932, Response filed Jan. 17, 2008 to Non-Final Office Action mailed Oct. 18, 2007, 13 pgs.
U.S. Appl. No. 10/929,932 Final Office Action mailed Apr. 30, 2008,17 pgs.
U.S. Appl. No. 10/929,932, Response filed Jul. 23, 2008 to Final Office Action mailed Apr. 30, 2008, 13 pgs.
U.S. Appl. No. 10/929,932, Non Final Office Action Mailed Oct. 16, 2008, 18pgs.
U.S. Appl. No. 10/929,932, Response filed Feb. 6, 2009 to Non-Final Office Action mailed Oct. 16, 2008, 16 pages.
U.S. Appl. No. 10/929,932, Final Office Action mailed May 21, 2009, 14 pgs.
U.S. Appl. No. 10/929,932 Response filed Jul. 21, 2009 to Final Office Action mailed May 21, 2009, 11 pgs.
U.S. Appl. No. 10/929,932, Response filed Jul. 21, 2009 to Final Office Action mailed May 21, 2009, 11 pgs.
U.S. Appl. No. 10/929,932, Advisory Action mailed Aug. 11, 2009, 3 pgs.
U.S. Appl. No. 10/929,932 Non Final Office Action Mailed Nov. 9, 2009, 16.
U.S. Appl. No. 10/929,932 Non-Final Office Action mailed Nov. 9, 2009, 15 pgs.
U.S. Appl. No. 10/929,932, Response filed Feb. 9, 2010 to Non Final Office Action mailed Nov. 9, 2009, 12 pgs.
U.S. Appl. No. 11/281,084, Non-Final Office Action mailed Jan. 22, 2007, 16 pgs.
U.S. Appl. No. 11/281,084, Response filed Apr. 23, 2007 to Non-final office action mailed Jan. 22, 2007, 11 pgs.
U.S. Appl. No. 11/281,084, Notice of Allowance mailed Jul. 24, 2007, 7 pgs.
U.S. Appl. No. 11/281,084, Notice of Allowance Mailed Nov. 29, 2007, 8 pgs.
U.S. Appl. No. 11/934,556, Ex-Parte Reexamination Final Office Action Mailed May 13, 2009, 6 pgs.
U.S. Appl. No. 11/934,556 Response filed Jul. 6, 2009 to Ex Parte Quayle Action mailed May 13, 2009, 3 pgs.
U.S. Appl. No. 11/934,556 Notice of Allowance Mailed Oct. 21, 2009,6 pgs.
U.S. Appl. No. 12/120,044, Restriction Requirement mailed Nov. 4, 2009, 8 pgs.
U.S. Appl. No. 10/744,632 Notice of Allowance mailed Nov. 3, 2009, 10 pgs.
U.S. Appl. No. 10/744,632 Supplemental Notice of Allowability mailed Nov. 17, 2009, 4 pgs.
U.S. Appl. No. 11/934,556 Notice of Allowance mailed Oct. 21, 2009, 6 pgs.
U.S. Appl. No. 10/118,576, Amendment and Response filed Jan. 26, 2004 to Final office action mailed Nov. 28, 2003, 13 pgs.

U.S. Appl. No. 10/118,576, Restriction Requirement mailed Apr. 3, 2003, 5 pgs.
U.S. Appl. No. 10/118,576, Reponse filed May 5, 2003 to Restriction Requirement mailed Apr. 3, 2003, 1 pg.
U.S. Appl. No. 10/232,267 Non Final Office Action mailed Mar. 26, 2004, 11 pgs.
U.S. Appl. No. 10/232,267 Response filed Jul. 23, 2004 to Non Final Office Action mailed Mar. 26, 2004, 23 pgs.
U.S. Appl. No. 10/232,267 Non Final Office Action mailed Oct. 19, 2004, 9 pgs.
U.S. Appl. No. 10/232,267 Response filed Jan. 11, 2005 to Non Final Office Action mailed Oct. 19, 2004, 20 pgs.
U.S. Appl. No. 10/232,267 Final Office Action mailed Apr. 6, 2005, 8 pgs.
U.S. Appl. No. 10/232,267 Response filed Aug. 26, 2005 to Final Office Action mailed Apr. 6, 2005, 5 pgs.
U.S. Appl. No. 10/232,267 Final Office Action mailed Oct. 17, 2005, 9 pgs.
U.S. Appl. No. 10/232,267 Response filed Mar. 3, 2006 to Final Office Action mailed Oct. 17, 2005, 21 pgs.
U.S. Appl. No. 10/232,267 Non Final Office Action mailed Jun. 29, 2006, 7 pgs.
U.S. Appl. No. 10/232,267 Non Final Office Action mailed Jul. 17, 2006, 7 pgs.
U.S. Appl. No. 10/232,267 Response filed Oct. 5, 2006 to Non Final Office Action mailed Jul. 17, 2006, 21 pgs.
U.S. Appl. No. 10/232,267 Final Office Action mailed Dec. 29, 2006, 8 pgs.
U.S. Appl. No. 10/232,267 Response filed Feb. 15, 2007 to Final Office Action mailed Dec. 29, 2006, 27 pgs.
U.S. Appl. No. 10/232,267 Advisory Action mailed Mar. 21, 2007, 3 pgs.
U.S. Appl. No. 10/232,267 Response filed Mar. 28, 2007 to Final Office Action mailed Dec. 29, 2006, 23 pgs.
U.S. Appl. No. 10/232,267 Notice of Allowance mailed Jan. 15, 2008, 11 pgs.
U.S. Appl. No. 10/744,632 Response filed Nov. 30, 2006 to Non Final Office Action mailed Oct. 5, 2006, 19 pgs.
U.S. Appl. No. 10/744,632, Response filed Mar. 26, 2007 to Final Office Action mailed Jan. 31, 2007, 18 pgs.
U.S. Appl. No. 10/744,632 Non Final Office Action mailed Jul. 2, 2007, 9 pgs.
U.S. Appl. No. 10/744,632 Response filed Feb. 11, 2008 to Final Office Action filed Dec. 13, 2007, 19 pages.
U.S. Appl. No. 10/744,632 Response filed Mar. 13, 2008 to Advisory Action mailed Feb. 25, 2008, 19 pgs.
U.S. Appl. No. 10/744,632 Final Office Action mailed Apr. 2, 2008, 9 pgs.
U.S. Appl. No. 10/744,632 Response filed Jun. 2, 2008 to Final Office Action mailed Apr. 2, 2008, 19 pages.
U.S. Appl. No. 10/744,632, Non-Final Office Action mailed Aug. 28, 2008, 10 pgs.
U.S. Appl. No. 10/744,632 Response filed Dec. 29, 2008 to Non-final office action mailed Aug. 28, 2008, 18 pages.
U.S. Appl. No. 10/744,632, Final Office Action mailed Mar. 4, 2009, 10 pgs.
U.S. Appl. No. 10/744,632 Notice of Allowance Mailed Nov. 3, 2009, 10.
U.S. Appl. No. 10/744,632, Supplemental Notice of Allowability Mailed Nov. 17, 2009, 4 Pgs.
U.S. Appl. No. 10/823,314 Non Final Office Action mailed Jan. 5, 2006, 7 pgs.
U.S. Appl. No. 10/823,314 Response filed Apr. 5, 2006 to Non Final Office Action mailed Jan. 5, 2006, 10 pgs.
U.S. Appl. No. 10/823,314 Final Office Action mailed Jul. 13, 2006, 7 pgs.
U.S. Appl. No. 10/823,314 Response filed Sep. 11, 2006 to Final Office Action mailed Jul. 13, 2006, 8 pgs.
U.S. Appl. No. 10/823,314 Advisory Action mailed Oct. 2, 2006, 3 pgs.
U.S. Appl. No. 10/823,314 Non Final Office Action mailed Dec. 5, 2006, 6 pgs.
U.S. Appl. No. 10/823,314 Response filed Feb. 13, 2007 to Non Final Office Action mailed Dec. 5, 2006, 13 pgs.
U.S. Appl. No. 10/823,314 response filed Oct. 31, 2007 to Final Office Action mailed Sep. 11, 2007., 13 pgs.
U.S. Appl. No. 10/823,314, Non-Final Office Action mailed Feb. 11, 2008, 7.
U.S. Appl. No. 10/823,314 Response filed May 12, 2008 to Non-Final Office Action mailed Feb. 11, 2008, 13 pages.
U.S. Appl. No. 10/823,314 Final Office Action mailed Aug. 28, 2008, 11 Pgs.
U.S. Appl. No. 10/823,314 Response filed Oct. 28, 2008 to Final Office Action mailed Aug. 28, 2008, 13 pages.
U.S. Appl. No. 10/823,314 Response filed Nov. 26, 2008 to Advisory Action mailed Nov. 19, 2008, 11 pages.
U.S. Appl. No. 10/823,314 Non Final Office Action Mailed on Feb. 4, 2009, 8.
U.S. Appl. No. 10/929,932 , Restriction Requirement mailed Aug. 23, 2005, 5 pgs.
U.S. Appl. No. 10/929,932 , Response filed Sep. 21, 2005 to Restriction Requirement mailed Aug. 23, 2005, 1 pg.
US 7,256,487, 08/2007, Poo et al. (withdrawn)

* cited by examiner

APPARATUS AND METHOD FOR PACKAGING CIRCUITS

This application is Continuation of U.S. application Ser. No. 11/934,556 filed Nov. 2, 2007 now U.S. Pat. No. 7,675,169 which is a is a Divisional of U.S. application Ser. No. 11/281,084 filed Nov. 17, 2005 now U.S. Pat. No. 7,358,154, which is a Divisional of U.S. application Ser. No. 10/929,932, filed Aug. 30, 2004, which is a Divisional of U.S. application Ser. No. 10/118,576, filed Apr. 8, 2002, now U.S. Pat. No. 6,894,386, which claims priority under 35 U.S.C. 119 from Singapore Application No. 200106182-9 filed Oct. 8, 2001, all of which are incorporated herein by reference in their entirety.

BACKGROUND

Wafers are fabricated with a plurality of dice each having a plurality of integrated circuit elements therein. A die represents one individual chip that must be separated from adjacent dice before packaging. Contacts are added to the die before packaging. One type of contact is a solder ball. Wafer level packaging (WLP) refers to the complete packaging of an electronic component at the die or the wafer level. WLP is normally considered as a true chip size package. However, the profile of most WLP is the sum of the thickness of the die and the solder balls. It is desired to reduce the profile and/or thickness of packaged components.

For the reasons stated above, for other reasons stated below, and for other reasons which will become apparent to those skilled in the art upon reading and understanding the present specification, there is a need in the art for an improved electronic component package and methods of packaging electronic components.

SUMMARY

Some embodiments of the invention are directed to integrated circuit dice and their method of manufacture. An embodiment of the invention includes an edge contact at a peripheral surface of the die. The edge contact connects to a bond pad through a line. In an embodiment, adjacent dice on a wafer are connected to a same edge contact. The edge contact is divided. In an embodiment, the edge contact is divided when the dice are separated. In an embodiment, the edge contact is in the saw street and is divided when the wafer is diced. The die, in some embodiments, includes a main body including a top layer, a bottom layer, and a peripheral edge surface extending between the top layer and the bottom layer. The main body includes an integrated circuit therein that is electrically connected to the bond pad. In an embodiment, the edge contact is beneath the top layer. In an embodiment, the edge contact is above the bottom layer such that the edge contact does not increase the height of the die. In an embodiment, the bond pad is at the top layer. In an embodiment, the die is encased by an encapsulant.

Some embodiments of the invention include methods for creating a die. An embodiment of the invention includes fabricating at least two dice on a wafer, wherein the at least two dice are joined at an electrically conductive element in a saw street, and separating the at least two dice from each other along the saw street. At least part of the electrically conductive element remains with each die. In an embodiment, the electrically conductive element is created by forming a recess in the saw street and filling the recess with an electrically conducting material. In an embodiment of the invention, the method includes connecting a bond pad from at least one of the dice to the electrically conductive material. An embodiment of the invention includes fabricating circuits for a memory device in at least one of the dice. In an embodiment of the invention, forming the recess includes sawing along the saw street to a depth of about half a height of the die. An embodiment of the invention includes connecting the bond pad includes depositing a metal on the wafer between the bond pad and the electrically conductive material.

A further embodiment of the method includes patterning a recess in a saw street intermediate adjacent dice in a wafer, depositing an electrically conductive material in the recess to form an edge contact, connecting a bond pad of both dice to the edge contact, and separating the adjacent dice along the saw street such that each dice includes a part of the edge contact. An embodiment of the invention includes masking the wafer such that the electrically conductive material is deposited only in the recess.

Embodiments of the invention also include substrates, wafers, integrated circuit packages, electrical devices, memory units, memory modules, electrical systems, computers, which include at least one die.

These and other embodiments, aspects, advantages, and features of the invention will be set forth in part in the description which follows, and in part will become apparent to those skilled in the art by reference to the following description of the invention and referenced drawings or by practice of the invention.

DETAILED DESCRIPTION

In the following detailed description of various embodiments, reference is made to the accompanying drawings which form a part hereof, and in which is shown by way of illustration specific embodiments in which the inventions may be practiced. These embodiments are described in sufficient detail to enable those skilled in the art to practice the invention, and it is to be understood that other embodiments may be utilized and that process, electrical or mechanical changes may be made. The terms wafer and substrate used in the following description include any base semiconductor structure. Both are to be understood as including silicon-on-sapphire (SOS) technology, silicon-on-insulator (SOI) technology, thin film transistor (TFT) technology, doped and undoped semiconductors, epitaxial layers of a silicon supported by a base semiconductor structure, as well as other semiconductor structures well known to one skilled in the art. The following detailed description is, therefore, not to be taken in a limiting sense, and the scope of the various embodiments is defined only by the appended claims and their equivalents.

The present description uses a reference number convention of the first digit corresponding to the figure in which the number references and the last two digits corresponding to like elements throughout the description. For example, the edge contact has a reference number of X09, where X is the number of figure on which the reference number first appears.

Figure 1:
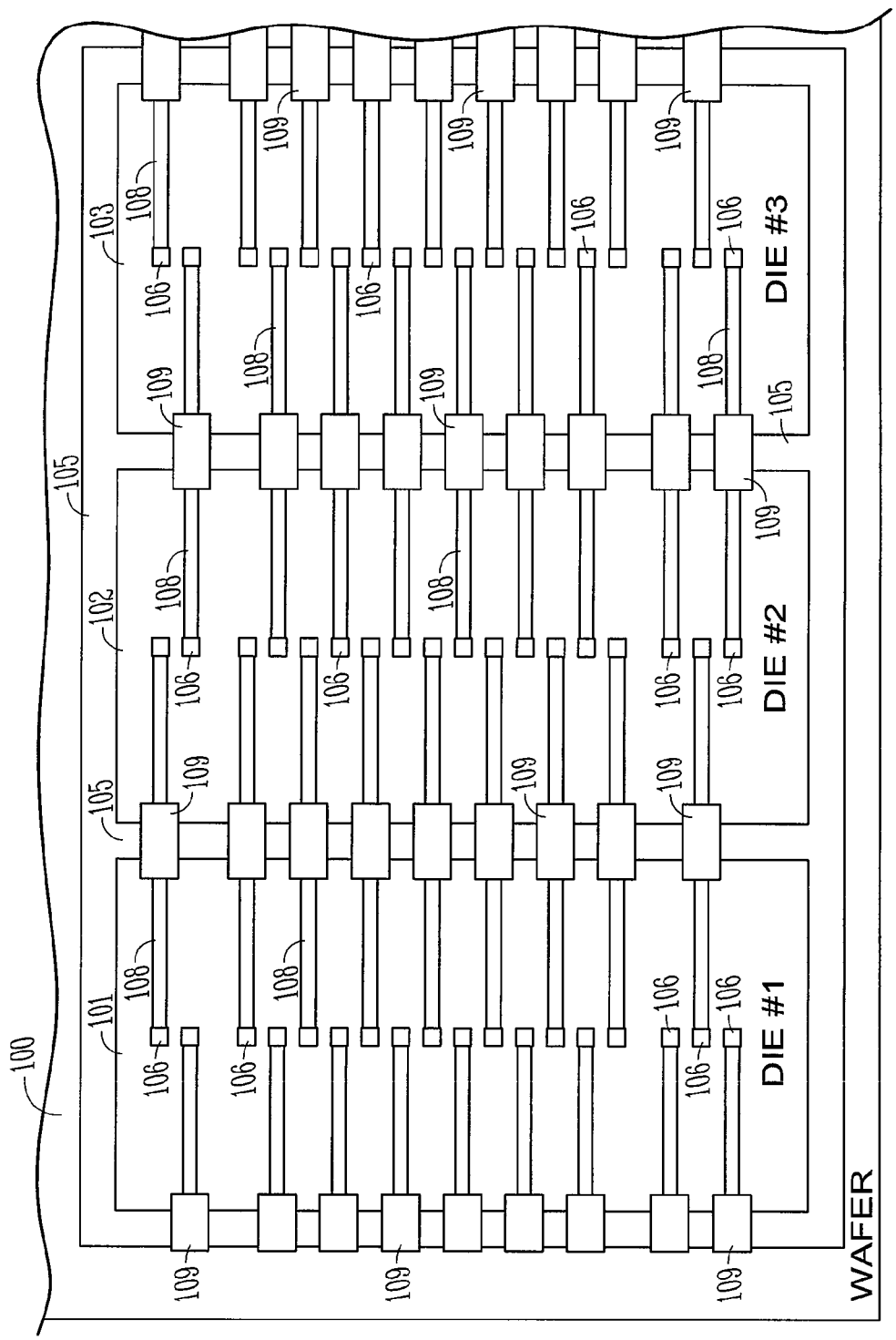
FIG. 1 is a top view of a wafer including a plurality of dice according to the invention.

FIG. 1 shows a wafer 100 including a plurality of dice 101, 102, and 103 that are joined together along saw streets 105. Wafer 100 is illustrated as a square wafer but it will be understood that the wafer is not so limited and includes 200 millimeter, 300 millimeter, and 450 millimeter wafers known to those of skill in the art. Moreover, wafer 100 is illustrated with only three dice 101, 102, 103 thereon. It will be understood that the wafer 100 may have greater than two or three dice. In an embodiment, the wafer has greater than one thousand dice. A die is an individual pattern, typically rectangular, on a substrate or wafer that contains circuitry, or integrated circuit devices, to perform a specific function. Each die 101-103 includes an electrical circuit fabricated thereon according to known techniques. The die 101-103 include integrated circuit elements such as capacitors, transistors, line, interconnects, plugs, pads, I/O connections, insulators, and/or other elements known in the art. These integrated circuit elements form electronic components such as processors and memory devices. Examples of memory devices include DRAM, SRAM, SDRAM, EEPROM, flash memory, ROM, etc. In an embodiment, semiconductor wafer 100 contains a repeated pattern of such dice containing the same functionality.

Dice 101-103 include bonding pads 106. In an embodiment, dice 101-103 are identical and are formed by repeating a mask pattern on the wafer 100. In an embodiment, pads 106 are at the top layer of the die. In an embodiment, pads 106 have a top surface aligned with the top surface of the thus-formed die. In an embodiment, pads 106 are aligned lengthwise along the middle of the die. Other embodiments of the invention are not limited to the pads 106 being positioned in the middle of the die. An electrically conductive line 108 extends from each of the pads 106 to the periphery of the die 101-103. Each line 108 electrically connects one pad 106 to one edge contact 109. Edge contacts 109 are positioned at the periphery of each die. Contacts 109 that are positioned at the periphery of two adjacent dice are integrally formed. That is, contacts 109 at the saw street 105 between die 101 and die 102 are connected to lines 108 of both die 101 and 102. These contacts 109 are separated during a separation or dicing operation as described herein. Each of the pads 106, lines 108, and contacts 109 are not labeled in FIG. 1 for clarity. Each unit of connected pad 106, line 108, and contact 109 act as input/output connections to the internal circuits of the die. In an embodiment, the dice 101-103 are separated and further processed, e.g., tested or packaged, to form an end integrated circuit product.

In an embodiment, third metal redistribution wafer level packaging technology is used on the wafer 100 to form the lines 108 from the bond pads 106 to the edge contacts 109. Channels are formed in the saw streets 105. In an embodiment, the wafer 100 is first sawed about half to about three-quarter way through at the saw streets 105. This forms the channels in the saw streets 105 between die 101-103. Electrically conductive material is patterned in the channels to form the edge contacts 109. Third metal redistribution on the wafer 100 creates the lines 108 out from the bond pads 106 to the edge contacts 109. In an embodiment, lines 108 on the adjacent dice 101, 102 or 102, 103 connect to the bond pads 106 of the adjacent die to a same edge contact as shown in FIG. 1. In an embodiment, the wafer 100 is coated with polymide (PI), benzocyclobutenes (BCB) or other non-conductive materials except at the edge contacts. Each individual die is then singulated by sawing, breaking at the saw-streets or grinding or other dicing methods known in the art. The electrical connections of the die 101, 102, or 103 to external devices are made through the edge contacts 109. In an embodiment, the singulated die 101, 102, or 103 is mounted on a printed circuit board with the land patterns created to correspond to the locations of via-holes on the board.

Figure 2:
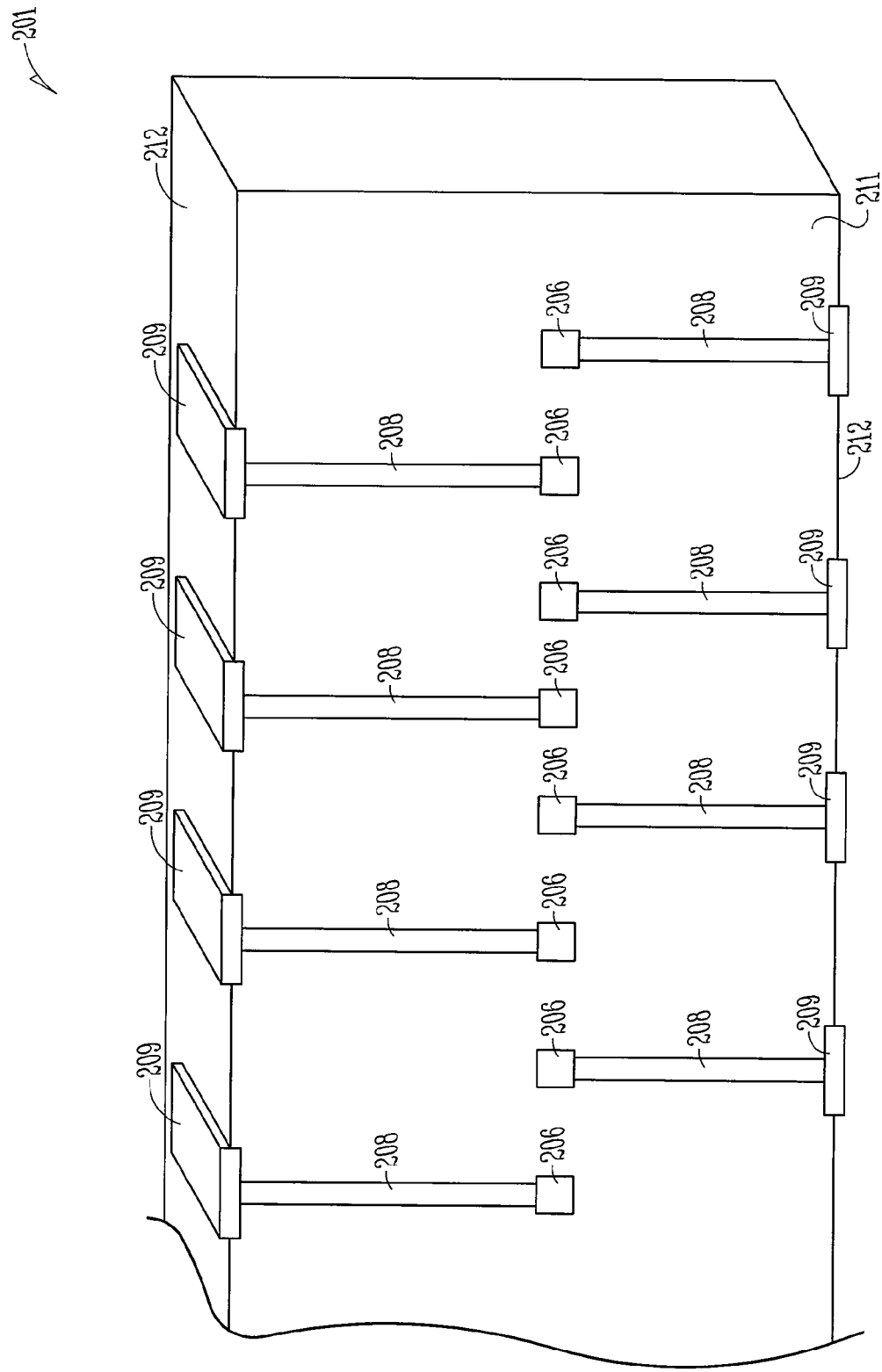
FIG. 2 is a perspective view of a die according to the invention.

FIG. 2 shows a die 201 including bonding pads 206, electrically conductive lines 208 and contacts 209. In an embodiment, the pads 206 are flush with the top surface 211 of the die 201. In an embodiment, the lines 208 are flush with the top surface 211 of the die 201. In an embodiment, the top surface of the contacts 209 are flush with the top surface 211 of the die 201. In an embodiment, the top surface of the contacts 209 are beneath the top surface 211 of the die 201. In an embodiment, the contacts 209 extend outwardly from the side surface 212 of the die 201. In an embodiment, contacts 209 are metal. In an embodiment, contacts 209 include tungsten. In an embodiment, contacts 209 include titanium. In an embodiment, the contacts 209 include a noble metal. In an embodiment, the contacts 209 include gold. In an embodiment, contacts 209 include a gold coating on another metal or metal alloy. In an embodiment, the contacts 209 include silver. In an embodiment, contacts 209 include a silver coating on another metal or metal alloy. The gold or silver coatings on contacts 209 are provided to improve the electrical connection between the contacts and external devices in which the die or chip 209 will be placed. In another embodiment, the chip 209 is enclosed, except for at least a portion of the contacts 209, by an encapsulant. Encapsulants are known to those of ordinary skill in the art of integrated circuit packaging.

Figure 3A:
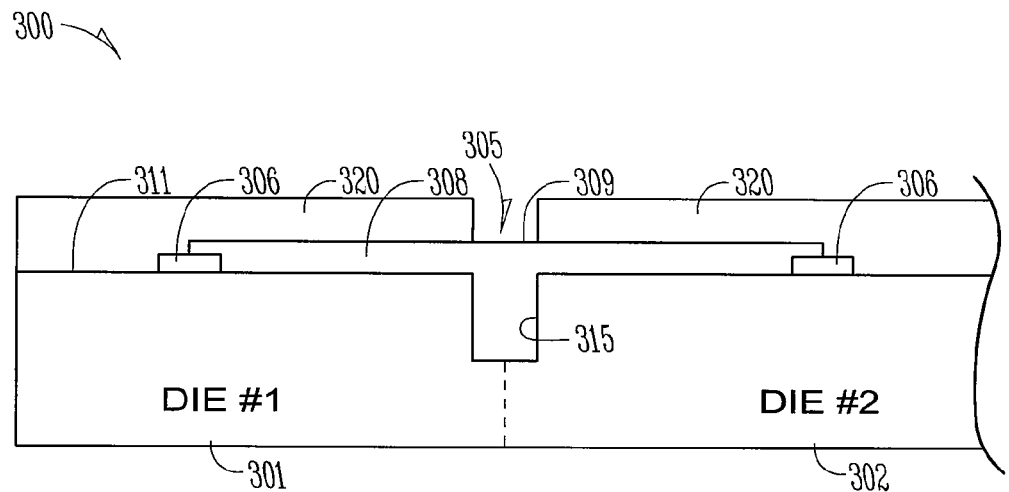
FIGS. 3A and 3B are cross sectional views of two dice according to an embodiment of the invention.

An embodiment for fabricating the die will now be described with reference to FIGS. 3A-3D. FIG. 3A shows a partial view of a wafer 300, which has undergone fabrication processing steps to form the desired integrated circuits on each die 301, 302. The fabrication steps include masking, depositing, etching, and other steps as understood in the art. In the saw street 305, a recess 315 is formed. In an embodiment, a recess 315 is formed in each saw street 305. In an embodiment, a recess 315 is formed in each saw street 305 along the longitudinal (longest) length of a rectangular die. In an embodiment, the recess 315 is formed on other sides of the die. For example, on a rectangular or square die, recesses are formed on all four sides of the die. In an embodiment, recess 315 extends downwardly from the top surface 311 of wafer 300 about half the height of the wafer or die. The recess 315, in an embodiment, is formed while forming integrated circuit structures in the dice. In an embodiment, recess 315 is etched into the wafer 300 after the circuits are formed in each die 301, 302. In an embodiment, the recess 315 extends the entire length of the saw street 305. Bond pads 306 are formed on the dice 301, 302 according to conventional processes. After the bond pads 306 are formed, the wafer top surface 311 is masked leaving open the area of the metal lines from bond pads 306 of one die 301 to bond pads 306 of the adjacent die 302. It is within the scope of the various embodiments to use positive or negative resist mask. The mask, in an embodiment, leaves open a wider area adjacent the saw street 305 on the dice 301, 302 and in the recess 315. The electrically conductive material for the lines 308 and the edge contacts 309 is deposited on the wafer 300. The material forms the lines 308 and edge contacts 309 in the open areas of the mask.

The recesses 315 are formed according to various embodiments of the invention. The wafer 300, e.g., dice 301, 302 and saw street 305, is masked leaving openings aligned with the location of the edge contact 309. Edge contact material, such as metal, is deposited in the opening to form the edge contact 309. In an embodiment, the mask and edge contact material on the mask is removed from the wafer 300. In an embodiment, the lines 308 are formed to connect the edge contact to at least one of the bond pads 306 of the adjacent dice 301, 302.

After the formation of the lines 308 of each die 301, 302, which lines are connected at edge contacts 309, the wafer 300 receives a passivation layer 320. In an embodiment, passivation layer 320 is deposited according to conventional techniques. Passivation layer 320 covers the entire wafer except over the edge contacts 309. In an embodiment, passivation layer 320 does not cover the saw street 305. In an embodiment, passivation layer 320 includes inorganic polymers. In an embodiment, passivation layer 320 includes benzocyclobutenes (BCB). In an embodiment, passivation layer 320 includes polymides (PI). In an embodiment, passivation layer 320 includes at least one of silicon dioxide, silicon nitride, or silicon oxynitride. In an embodiment, passivation layer 320 includes organic polymers.

Figure 3B:
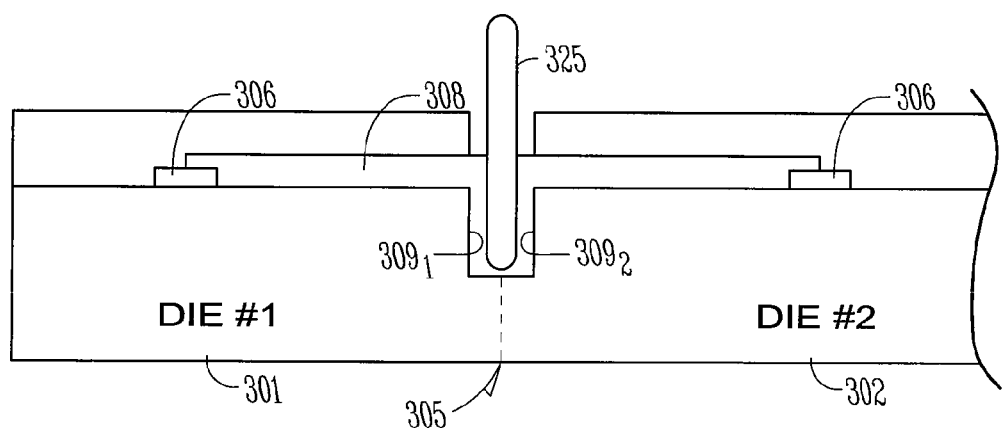
Figure 3C:
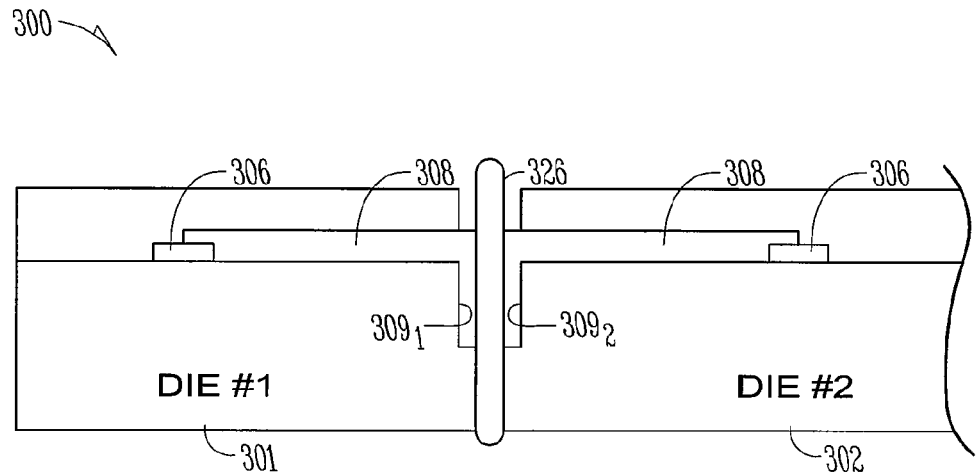
FIGS. 3C and 3D are cross sectional views of two dice according to an embodiment of the invention.
Figure 3D:
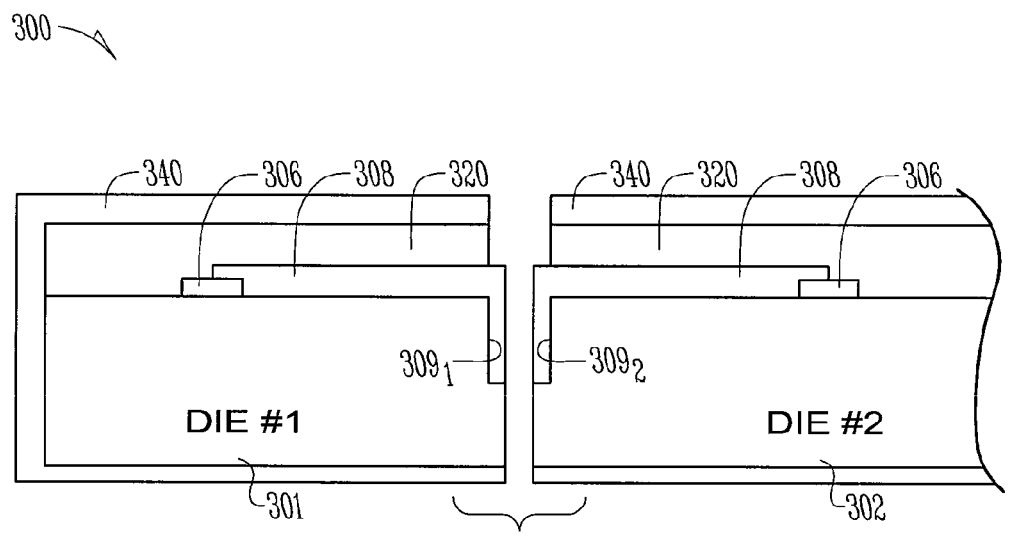

A cutter 325 is aligned with the saw street 305, and, in particular, with edge contact 309 (FIG. 3B). Cutter 325 cuts a center portion of the contact 309 to create edge contacts $309_1$ and $309_2$. Edge contact $309_1$ is on the peripheral edge surface of the first die 301. Edge contact $309_2$ is on the peripheral edge surface of the second die 302. In an embodiment, cutter 325 only cuts the contact 309, thus creating a scribe in the wafer 300 along saw street 305. Adjacent wafers 301, 302 can be separated along the scribe by using a scribe and break technique. Referring to FIG. 3C, the cutter 326 completely cuts through the wafer 300 along the saw street 305. In an embodiment, at least one of cutters 325, 326 is a saw. In an embodiment, both of cutters 325, 326 are saws. In an embodiment, at least one of cutters 325, 326 is a laser. After the dice 301, 302 are separated, each die 301, 302 includes edge contacts $309_1$, $309_2$ at peripheral surfaces of the die. Accordingly, the dice 301, 302 have a height equal to the die or wafer height and the edge contacts 309 do not add to the height of the separated dice.

Once the dice 301, 302 are separated each is individually packaged in an encapsulant 340. The encapsulant 340 surrounds the dice 301, 302 except for at least part of the edge contacts 309. Thus, the encapsulant 340 protects the dice 301, 302 from an operating environment while the edge contacts 309 provide input and output signals to the circuits internal to the packaged die 301, 302.

Figure 4A:
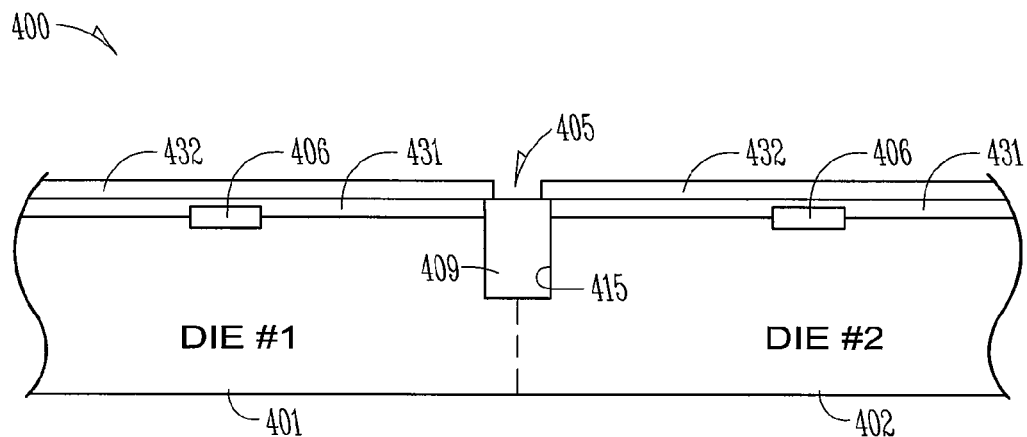
FIGS. 4A, 4B, and 4C are cross sectional views of two dice according to an embodiment of the invention.
Figure 4B:
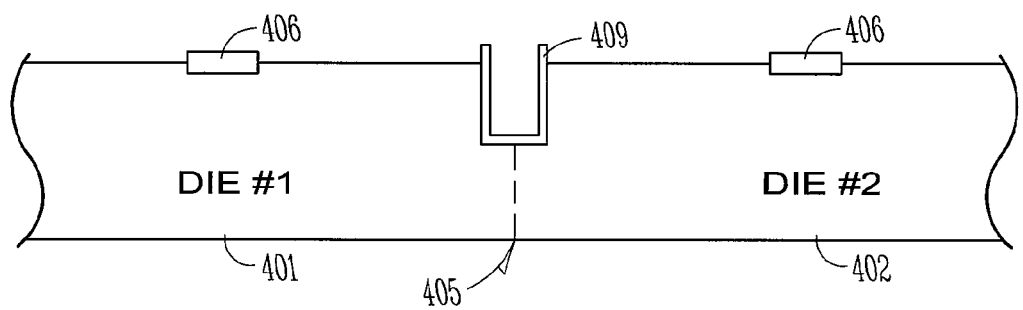
Figure 4C:
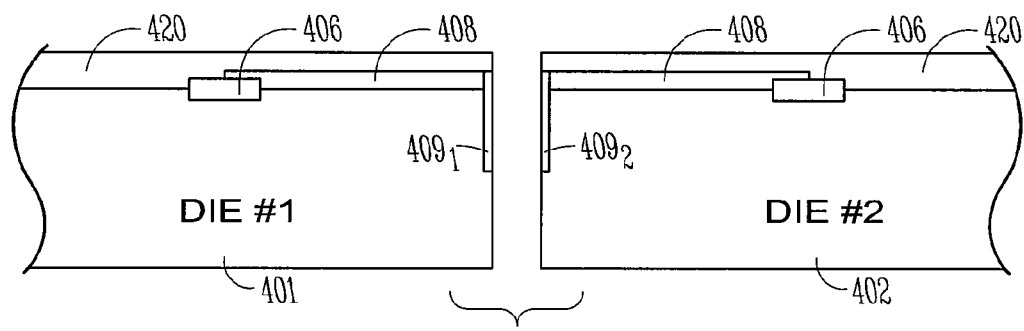

FIGS. 4A, 4B, and 4C are cross sectional views of two dice 401, 402 according to an embodiment of the invention. Wafer 400 includes a plurality of dice 401, 402. Each die 401, 402 includes circuits, such as integrated circuits, fabricated according to conventional processes. The circuits require communication to external circuits such as a buss, mother boards, and other electronic devices. Consequently, each die 401, 402 includes a bond pad 406. Wafer 400 further includes saw streets 405 dividing the dice 401, 402 whereat the dice are separated. A recess 415 is formed in the saw street 405 that is intermediate the dice 401, 402. For example, a mask layer 431 is formed over the wafer 400 except where the edge contact 409 is to be positioned. The mask layer 431 is formed according to techniques known to one of skill in the art. The electrically conductive material of the edge contact 409 is deposited into the recess. The conductive material of edge contact 409, in an embodiment, is sputtered onto the wafer. In an embodiment, the conductive material of the edge contact 409 is deposited by chemical vapor deposition. In an embodiment, the conductive material of the edge contact 409 is deposited by evaporation sources. In an embodiment, the conductive material of the edge contact 409 is deposited by electron gun evaporation. In an embodiment, the edge contacts 409 are formed after lines 408 are formed.

After formation of the unitary edge contact 409 in the form of a solid plug of electrically conductive material in the saw street recess 415, a second masking layer 432 is formed over the wafer 400. Masking layer 432 extends a distance over the sides of the contact 409. The width of the extension of the masking layer 432 over the contact 409 is essentially equal to the width of the finished edge contacts $409_1$ and $409_2$ on the respective dice 401 and 402. The unitary contact 409 is etched away where it is not covered by masking layer 432. In an embodiment, contact 409 is etched down to the portion of the wafer 400 beneath the recess. In an embodiment, contact 409 is etched so that it has a U-shape. Thereafter, the masking layers 431, 432 are removed (FIG. 4B). The dice 401 and 402 are then separated or diced (FIG. 4C). The individual dice 401 and 402 are then packaged, e.g., for example coated with a encapsulant, except for at least part of the edge contacts 409.

Figure 5:
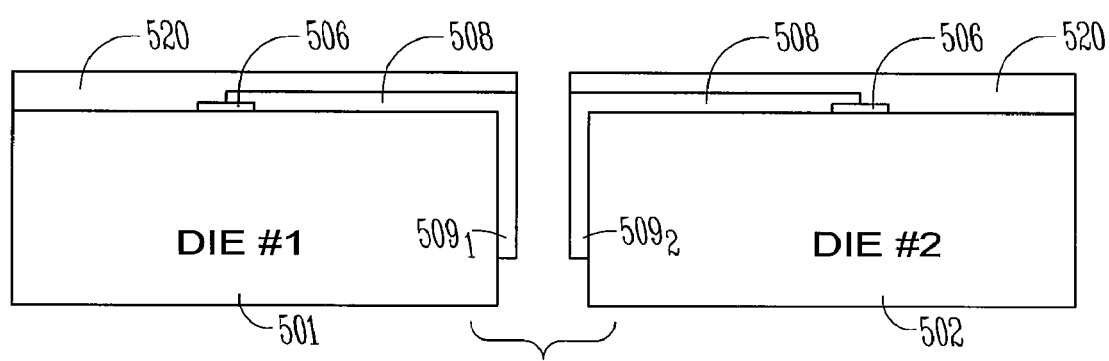
FIG. 5 is a view of two dice separated according to the teachings of an embodiment of the invention.

FIG. 5 shows an embodiment which includes the wafer 500 being diced into a plurality of dice 501, 502. Each die 510, 502 includes bond pads 506 and electrical signal carrying lines 508. The edge contacts 509 are connected to the lines 508. The edge contacts 509 are formed according to various embodiments. The edge contacts 509, in this embodiment, extend to the top surface of the passivation layer 520. That is, the top surface of the edge contact 509 is essentially in the same plane as the top surface of the passivation layer. In an embodiment, the edge contacts 509 have a top surface that is essentially in the same plane as a top surface of the encapsulant encasing the die 501. In an embodiment, the edge contacts 509 have a bottom surface that is essentially in the same plane as a bottom surface of the encapsulant encasing the die 501. In an embodiment, the edge contacts 509 have a height greater than one-half the height of the peripheral edge surface of the die. In an embodiment, the edge contacts 509 extend along approximately 75% of the height of the peripheral surface of the die.

Figure 6:
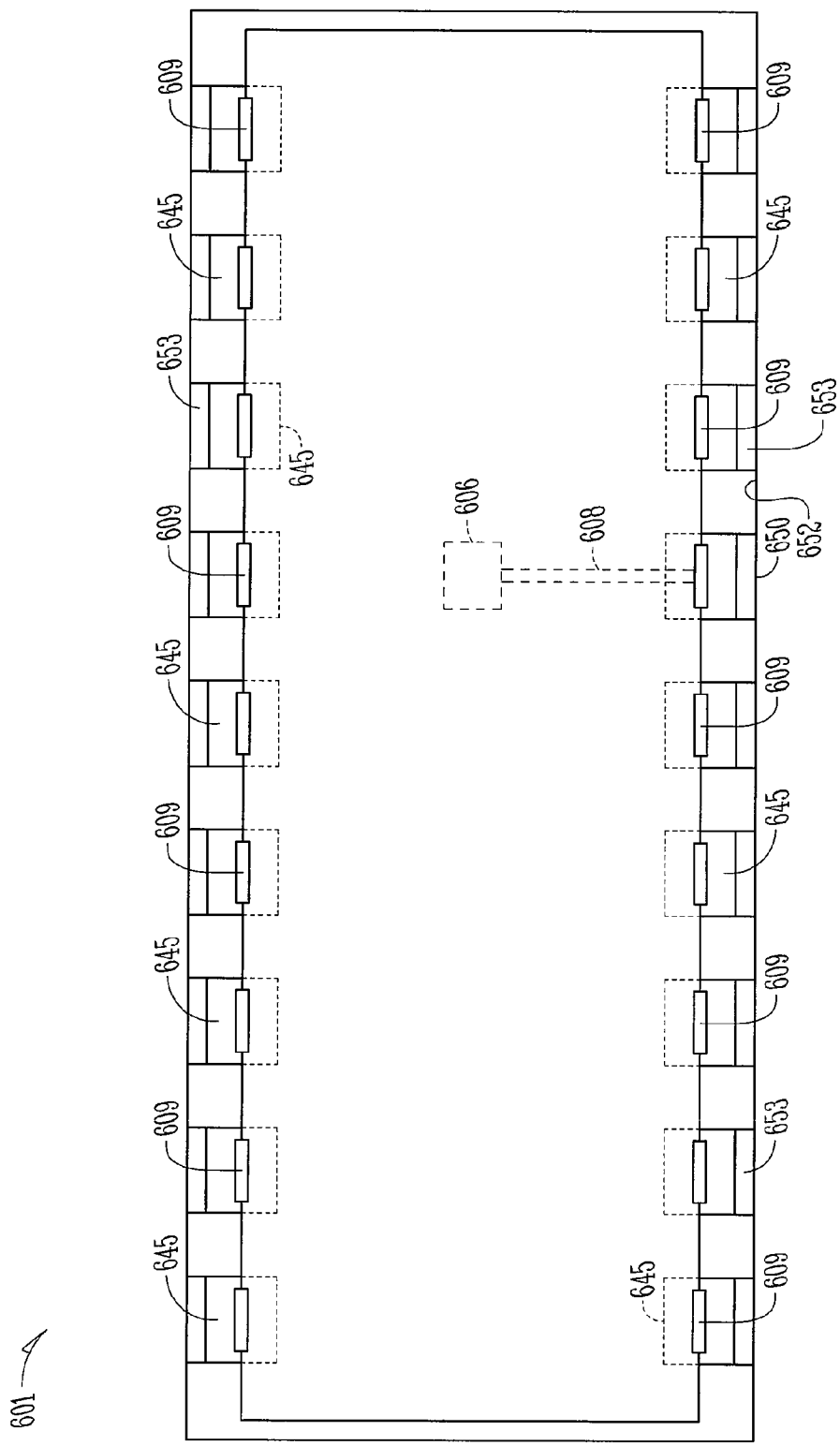
FIG. 6 is a top view of a die in a package according to the teachings of an embodiment of the invention.

FIG. 6 shows top view of a singulated land grid array, and a packaged die 601. Each of the edge contacts 609 are in electrical and physical contact with a contact pad 645. The contact pads 645 extend under the main body of the packaged die 601. In an embodiment, contact pads 645 extend outward of the main body of the packaged die 601. Contact pads 645 act as contacts between the circuits external to the packaged die 601 and the die 601 through edge contacts 609, lines 608 and bond pads 606. Only one set of lines 608 and bond pads 606 are shown in FIG. 6 for sake of clarity. It will be understood that each of the edge contacts 609 may be connected to a line 608, which in turn is connected to a bonding pad 606. FIG. 6 further illustrates line 608 and pad 609 in broken line as they are covered by an encapsulation layer that surrounds the die per se and protects the internal circuits from the environment, e.g., dirt, debris, moisture and the like.

An electrical device 650 includes a socket, slot, recess or the like 652 which includes device contacts 653. The packaged die 601 is adapted to be received in the socket 652, wherein the contact pads 645 engage contacts 653. The contacts 653 are electrically connect with communication lines connected to external circuits of the electrical device 650. Electrical device 650 includes mother boards, computers, consumer electronics, printed circuit boards, and the like. The contact pads 645, in an embodiment, press fit against the device contacts 653 to hold the die 601 in the socket 652. In an embodiment, the edge contacts 609 directly contact device contacts 653.

An embodiment of the invention includes fixing contact pads 645 to a substrate (not shown). The substrate is fixed to the bottom of the die. Encapsulant and substrate encase the die to protect it from the environment. Contact pads 645 and edge contacts 609 are electrically conductive. In an embodiment, pads 645 and contacts 609 are made of a metal. In an embodiment, at least one of contacts 609 and pads 645 include a metal alloy. In an embodiment, pads 645 include copper. In an embodiment, pads 645 include a noble metal. In an embodiment, pads 645 include gold. In an embodiment, pads 645 include silver. The encapsulant, in an embodiment, encases the die without a substrate.

Circuit Modules

Figure 7:
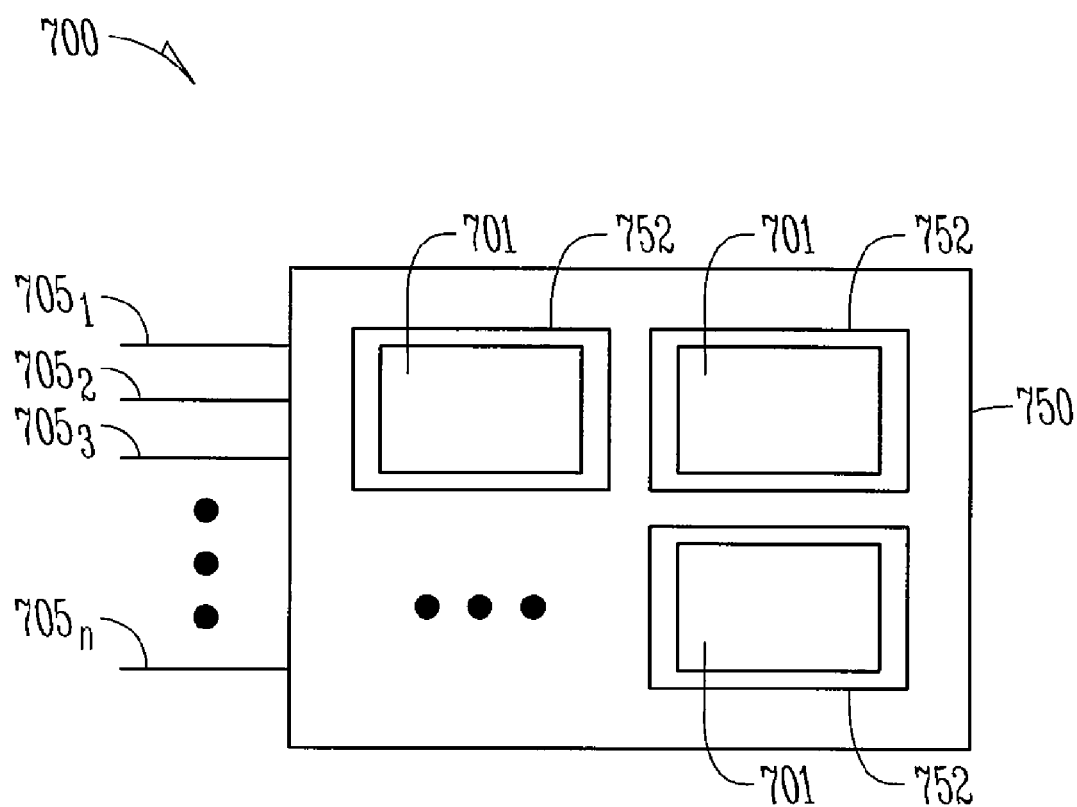
FIG. 7 is a view of a circuit module according to the teachings of an embodiment of the invention.

As shown in FIG. 7, two or more dice 701 may be combined, with or without protective casing, into a circuit module 700 to enhance or extend the functionality of an individual die 701. Circuit module 700 may be a combination of dice 701 representing a variety of functions, or a combination of dice 701 containing the same functionality. In an embodiment, circuit module 700 includes at least one socket, slot, recess or the like 752 into which the die 701 is received. One or more dice 701 of circuit module 700 include I/O structures in accordance with various embodiments of the invention and/or are fabricated in accordance with various embodiments of the invention. In an embodiment, dice 701 are inserted into a slot 752 in a circuit board 750 such that the contacts 209, 309, 509, or 609 are in electrical communication with the contacts in the slot 752. In an embodiment, contacts 209, 309, 509, or 609 are in physical contact with contacts in the slot 752. In an embodiment, the contacts 209, 309, 509, or 609 are press fit into the slot 752 against the contacts of the slot.

Numeral 752 in FIG. 7, in another embodiment, represents a mount including land patterns whereat the contacts are mounted. The mounting process includes an SMT process. For example, circuit module 700 is a printed circuit board having land patterns on which solder paste is applied, e.g., by printing the solder paste. A die 701 is picked and placed at the mount with the die contacts 209, 309, 509, or 609 aligned with the paste covered contacts of the mount. Either the die contacts or the mount contacts are reflowed to create a physical and electrical connection.

Some examples of a circuit module include memory modules, device drivers, power modules, communication modems, processor modules and application-specific modules, and may include multilayer, multichip modules. Such modules will have a chip receiver in which a chip is inserted. Circuit module 700 may be a subcomponent of a variety of electronic systems, such as a clock, a television, a cell phone, a personal computer, an automobile, an industrial control system, an aircraft and others. Such modules will have a circuit module receiver in which a circuit module is inserted. Circuit module 700 will have a variety of leads $705_1$ through $705_N$ extending therefrom and coupled to the contacts 209, 309, 409, or 509 of dice 701 providing unilateral or bilateral communication and control.

Figure 8:
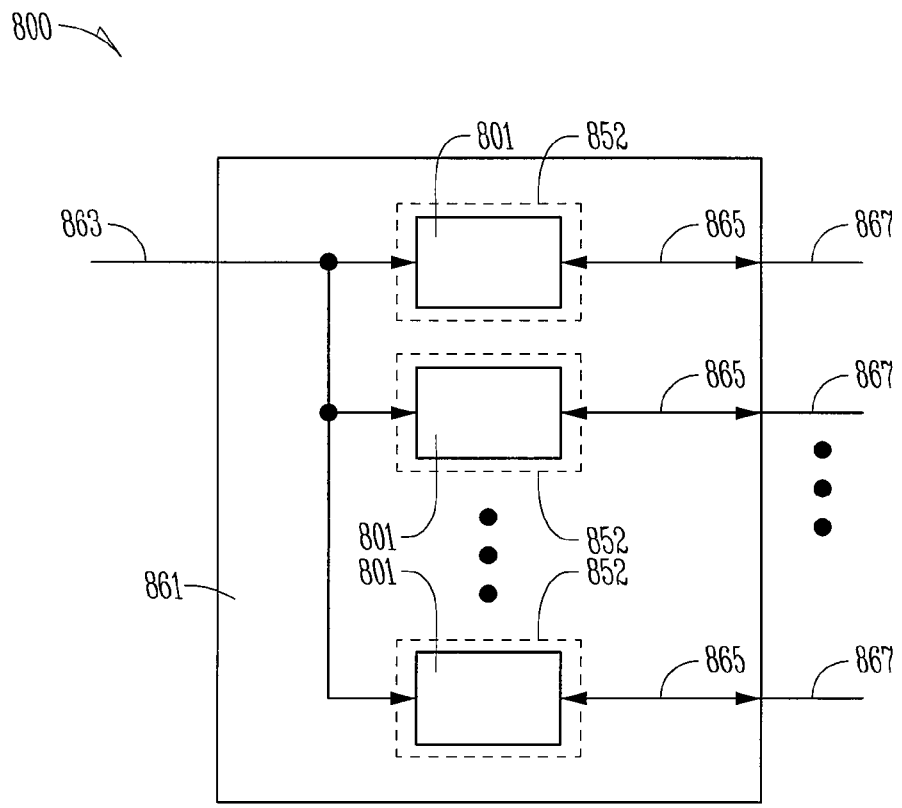
FIG. 8 is view of a memory module according to the teachings of an embodiment of the invention.

FIG. 8 shows one embodiment of a circuit module as memory module 800. Memory module 800 contains multiple memory devices 801 contained on support 861. In an embodiment, support 861 includes slots 852 for receiving memory devices 801 as described herein. The number of memory devices generally depends upon the desired bus width and the desire for parity. Memory devices 801 may include one or more dice in accordance with various embodiments of the invention. The support 861 includes sockets, slots, recesses or the like 852, each adapted to receive a memory device 801 and provide electrical communication between a bus and memory device 801. Memory module 800 accepts a command signal from an external controller (not shown) on a command link 863 and provides for data input and data output on data links 865. The command link 863 and data links 865 are connected to leads 867 extending from the support 815. Leads 867 are shown for conceptual purposes and are not limited to the positions shown in FIG. 8.

Electronic Systems

Figure 9:
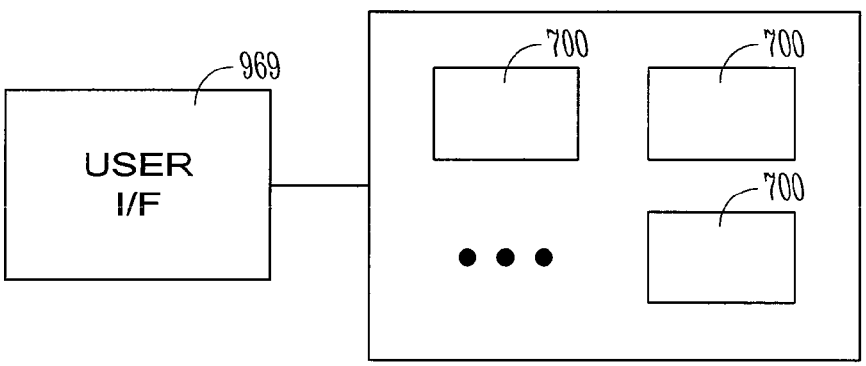
FIG. 9 is a view of an electronic system according to the teachings of an embodiment of the invention.

FIG. 9 shows one embodiment of an electronic system 900 containing one or more circuit modules 700. At least one of the circuit modules 700 contains a die in accordance with various embodiments of the invention. Electronic system 900 generally contains a user interface 969. User interface 969 provides a user of the electronic system 900 with some form of control or observation of the results of the electronic system 900. Some examples of user interface 969 include the keyboard, pointing device, monitor or printer of a personal computer; the tuning dial, display or speakers of a radio; the ignition switch, gauges or gas pedal of an automobile; and the card reader, keypad, display or currency dispenser of an automated teller machine. User interface 969 may further describe access ports provided to electronic system 900. Access ports are used to connect an electronic system to the more tangible user interface components previously exemplified. One or more of the circuit modules 700 may be a processor providing some form of manipulation, control or direction of inputs from or outputs to user interface 969, or of other information either preprogrammed into, or otherwise provided to, electronic system 900. In an embodiment, electronic system 900 includes memory modules 800. As will be apparent from the lists of examples previously given, electronic system 900 will often be associated with certain mechanical components (not shown) in addition to circuit modules 700 and user interface 969. It will be appreciated that the one or more circuit modules 700 in electronic system 900 can be replaced by a single integrated circuit. Furthermore, electronic system 900 may be a subcomponent of a larger electronic system.

Figure 10:
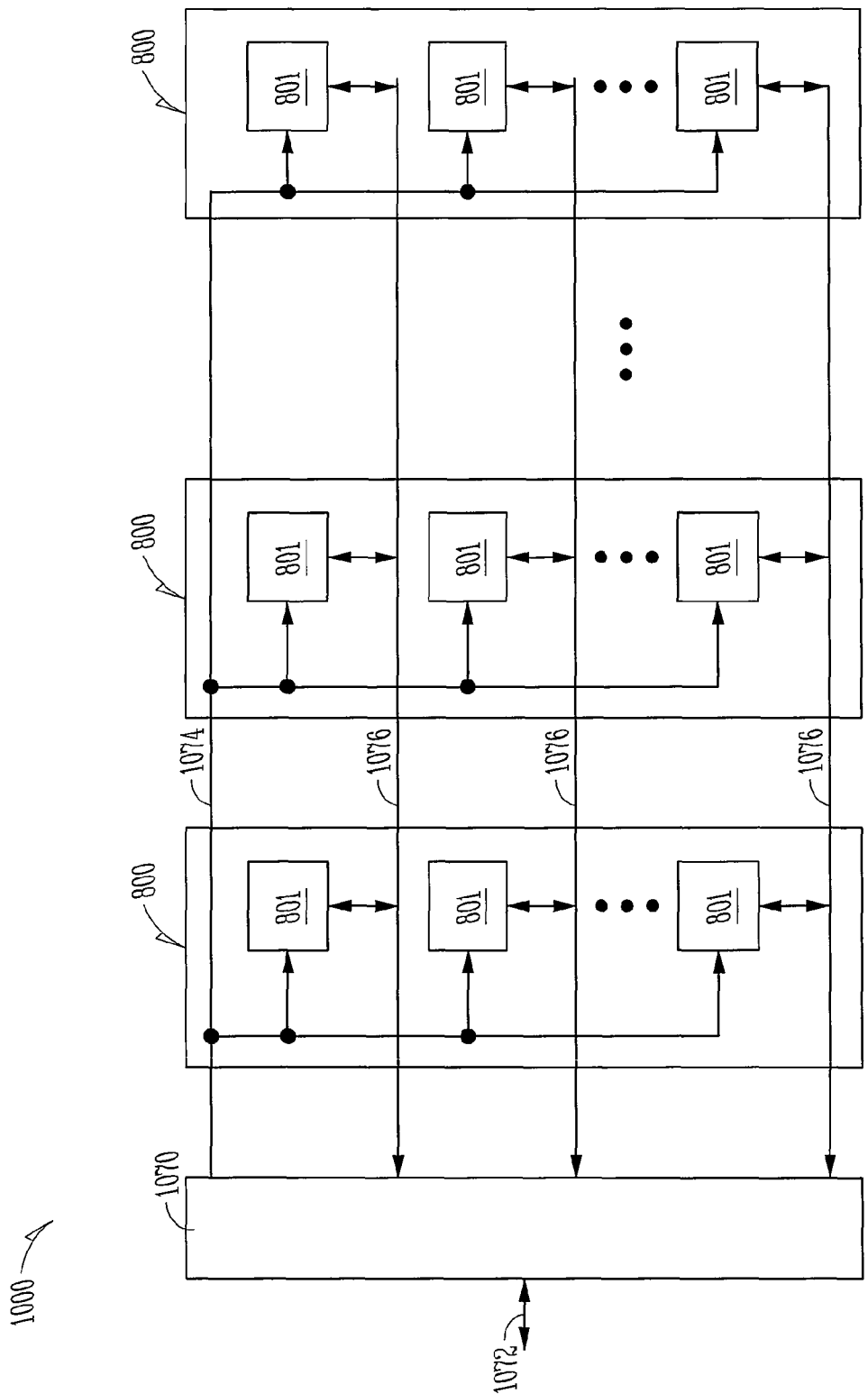
FIG. 10 is a view of an electronic system according to the teachings an embodiment of the invention.

FIG. 10 shows one embodiment of an electronic system as memory system 1000. Memory system 1000 contains one or more memory modules 800 and a memory controller 1070. At least one of the memory modules 800 includes a die in accordance with various embodiments of the invention. Memory controller 1070 provides and controls a bidirectional interface between memory system 1000 and an external system bus 1072. Memory system 1000 accepts a command signal from the external bus 1072 and relays it to the one or more memory modules 800 on a command link 1074. Memory system 1000 provides for data input and data output between the one or more memory modules 800 and external system bus 1072 on data links 1076.

Figure 11:
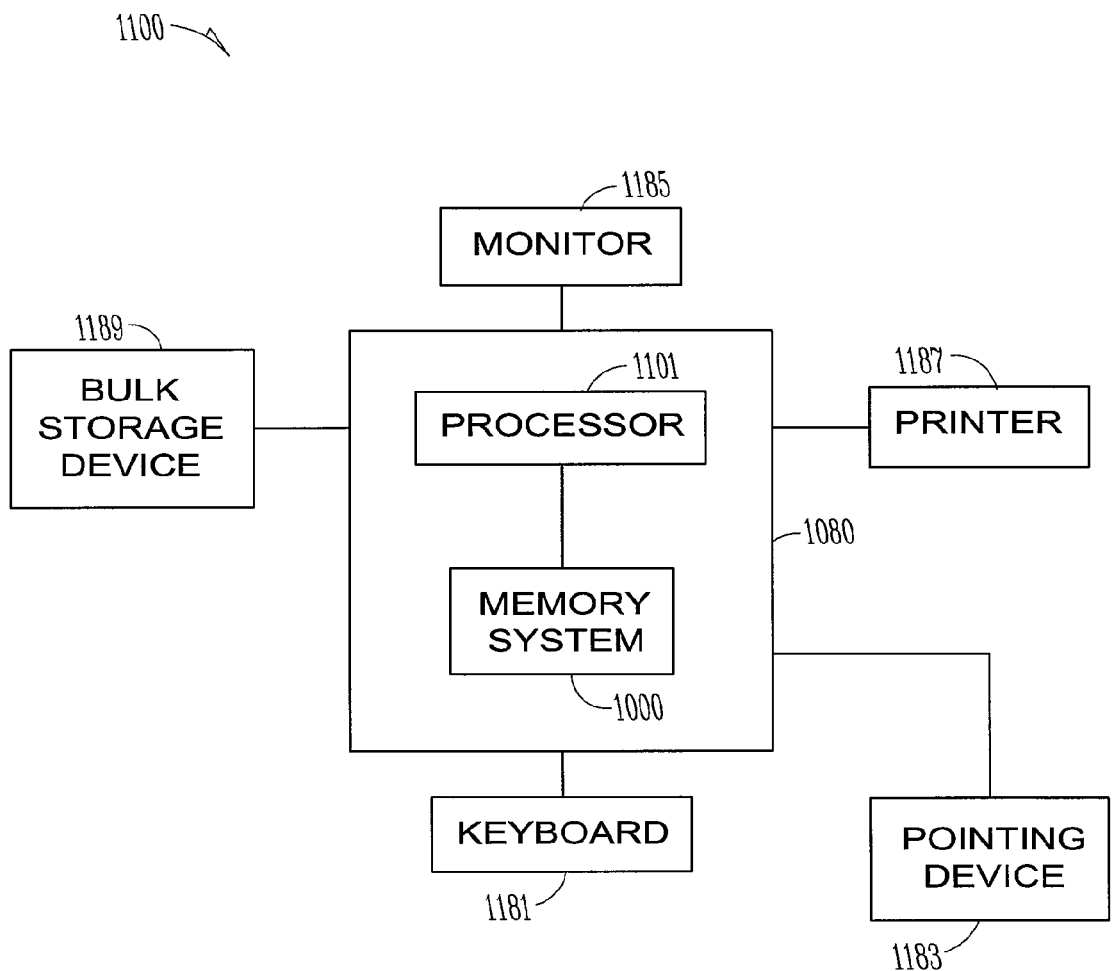
FIG. 11 is a view of a computer system according to the teachings of an embodiment of the invention.

FIG. 11 shows a further embodiment of an electronic system as a computer system 1100. Computer system 1100 contains a processor 1101 and a memory system 1000 housed in a computer unit 1180. In an embodiment, the memory system 1000 includes a die in accordance with various embodiments of the invention. In an embodiment, processor 1101 includes a die in accordance with various embodiments of the invention. Computer system 1100 is but one example of an electronic system containing another electronic system, i.e., memory system 1000, as a subcomponent. Computer system 1100 optionally contains user interface components. Depicted in FIG. 11 are a keyboard 1181, a pointing device 1183 such as a mouse, trackball, or joystick, a monitor 1185, a printer 1187 and a bulk storage device 1189. It will be appreciated that other components are often associated with computer system 1100 such as modems, device driver cards, additional storage devices, etc. These other components, in an embodiment, include a die in accordance with various embodiments of the invention. It will further be appreciated that the processor 1101 and memory system 1000 of computer system 1100 can be incorporated on a single integrated circuit. Such single package processing units reduce the communication time between the processor and the memory circuit.

CONCLUSION

It is desired to reduce the size of packaged components. This results in packaging material savings and increases throughput by reducing packaging times. Moreover, with the growing popularity of smaller electronic device the electronic components must be as small as possible. Some embodiments of the invention provide methods for producing a packaged die. In an embodiment, the cutter cuts along the saw street but does not cut all the way through the wafer. Thus, channels intermediate the dice are created. Edge contact material is deposited or patterned in the channels. The dice are diced. The dice will have edge contacts around the periphery of the die. Thus, the contacts do not add to the height of the die and/or package. Accordingly, some embodiments of the invention provide an extremely low profile package, i.e., the package thickness is essentially the same as the die thickness. Shorter length contacts may further provide superior signal integrity along with space savings.

Although specific embodiments have been illustrated and described herein, it will be appreciated by those of ordinary skill in the art that any arrangement which is calculated to achieve the same purpose may be substituted for the specific embodiments shown. Many adaptations of the invention will be apparent to those of ordinary skill in the art. For example, other integrated circuit processing equipment may be utilized in conjunction with various embodiments of the invention. For another example, other integrated circuit fabrication processes are adapted to produce the dice and chips according to some embodiments of the invention. It is manifestly intended that the various embodiments of this invention be limited only by the following claims and equivalents thereof.

What is claimed is:

1. An apparatus comprising an integrated circuit die, the integrated circuit die including:
    a main body including a top layer, a bottom layer, and a peripheral edge surface extending between the top layer and the bottom layer;
    a bond pad on the main body;
    an edge contact at the peripheral edge surface, wherein the edge contact includes a bottom surface that is substantially in the same plane as a surface of an encapsulant encasing the die; and
    a line connecting the bond pad to the edge contact.

2. The apparatus of claim 1, wherein the edge contact includes a top surface and an edge surface, and wherein the top, bottom, and edge surfaces of the edge contact form a circumferential edge contact.

3. The apparatus of claim 2, wherein the edge contact has an outer peripheral surface that is substantially coplanar with the peripheral edge surface of the main body.

4. The apparatus of claim 1, wherein the edge contact is configured to make electrical contact with a contact pad extending under the main body.

5. The apparatus of claim 4, wherein the edge contact includes a top surface and an edge surface, and wherein the edge contact and the contact pad form a "C" shape at the peripheral edge surface.

6. An apparatus comprising a grid array packaged die, comprising:
    an integrated circuit die comprising:
        a main body including a top layer, a bottom layer, and a peripheral surface extending between the top layer and the bottom layer;
        a bond pad on one of: the top layer and the bottom layer of the main body;
        an edge contact at the peripheral edge surface, wherein the edge contact includes a bottom surface that is substantially in the same plane as a surface of an encapsulant at least partially encasing the die; and
        a line connecting the bond pad to the edge contact; and
    a contact pad on the other of: the top layer and the bottom layer of the main body, wherein the contact pad is not formed on the same layer of the main body on which the bond pad is formed, the contact pad communicatively coupled to the edge contact.

7. The apparatus of claim 6, wherein the edge contact includes a top surface and an edge surface, and wherein the edge contact and the contact pad form a "C" shape at the peripheral edge surface.

8. The apparatus of claim 6, including a substrate, wherein the contact pad is fixed to the substrate.

9. The apparatus of claim 8, wherein the encapsulant at least partially encases the integrated circuit die and the substrate.

10. The apparatus of claim 8, wherein the substrate is configured to be received in a socket.

11. The apparatus of claim 6, including a capacitive circuit element communicatively coupled to the bond pad.

12. An apparatus comprising a grid array packaged die, comprising:
    an integrated circuit die comprising:
        a main body including a top layer, a bottom layer, and a peripheral surface extending between the top layer and the bottom layer;
        a bond pad on one of: the top layer and the bottom layer of the main body;
        an edge contact embedded in the peripheral edge surface; and
        a redistribution line on the bond pad layer connecting the bond pad to the edge contact; and
    a contact pad on the other of: the top layer and the bottom layer of the main body, wherein the contact pad is formed on a different layer of the main body than the bond pad, the contact pad communicatively coupled to the edge contact.

13. The apparatus of claim 12, including an encapsulant at least partially encasing the die,
    wherein the edge contact includes a bottom surface that is substantially in the same plane as a bottom surface of the encapsulant and a top surface that is substantially in the same plane as a top surface of the encapsulant.

14. The apparatus of claim 12, including an encapsulant encasing the die, wherein the edge contact includes a top surface, and wherein the edge contact forms a circumferential edge contact at the peripheral edge surface.

15. The apparatus of claim 14, wherein the edge contact and the contact pad form a "C" shaped contact.

16. The apparatus of claim 12, wherein the contact pad is fixed to a substrate and is configured for surface mounting to a conductive line of a circuit board.

17. A wafer, comprising:
a plurality of integrated circuit dice, wherein each integrated circuit die includes a bond pad;
saw streets between adjacent pairs of the plurality of dice;
an edge contact recessed in a saw street between an adjacent pair of the integrated circuit dice, wherein the edge contact does not extend above top surfaces of the pair of adjacent dice;
a first electrically conductive line extending from a bond pad of a first die of the pair of dice to the edge contact;
a second electrically conductive line extending from a bond pad of a second die of the pair of dice to the edge contact; and
a passivation layer covering a portion of the wafer excluding the edge contact.

18. The wafer of claim 17, wherein at least one of the integrated circuit dice includes a capacitive circuit element.

19. The wafer of claim 17, wherein a bond pad is on a top surface of at least one of the integrated circuit dice and the edge contact is at a peripheral surface of the at least one of the integrated circuit dice.

20. The wafer of claim 17, wherein the first die and the second die have substantially coplanar top surfaces and substantially coplanar bottom surfaces, and wherein the edge contact does not extend below the bottom surfaces.

\* \* \* \* \*

UNITED STATES PATENT AND TRADEMARK OFFICE
CERTIFICATE OF CORRECTION

| | | |
|---|---|---|
| PATENT NO. | : 8,115,306 B2 | |
| APPLICATION NO. | : 12/705277 | |
| DATED | : February 14, 2012 | |
| INVENTOR(S) | : Chia Yong Poo et al. | |

It is certified that error appears in the above-identified patent and that said Letters Patent is hereby corrected as shown below:

On the Title Page, Item (57) Abstract "that substantially" should read --that is substantially--

In the Specifications:

Column 2, lines 6 and 7, "connecting the bond pad includes" should read --connecting the bond pad that includes--

Column 2, line 47, "is view" should read --is a view--

Column 2, line 52, "teachings an embodiment" should read --teachings of an embodiment--

Column 2, line 60, "which is shown" should read --which are shown--

Column 3, line 13, "corresponding" should read --correspond--

Column 3, line 16, "of figure" should read --of the figure--

Column 3, line 57, "are" should read --is--

Column 3, line 58, "act" should read --acts--

Column 4, line 24, "are" should read --is--

Column 4, line 25, "are" should read --is--

Column 6, line 48, "shows top" should read --shows a top--

Column 6, line 57, "are" should read --is--

Signed and Sealed this
Eighteenth Day of June, 2013

Teresa Stanek Rea
*Acting Director of the United States Patent and Trademark Office*

CERTIFICATE OF CORRECTION (continued)
U.S. Pat. No. 8,115,306 B2

Column 7, line 1, "connect" should read --connected--

Column 7, line 9, "mother boards," should read --motherboards,--

Column 7, line 16, "include" should read --includes--

Column 9, line 21, "device" should read --devices--

In the Claims:

Column 10, line 66, "C shaped contact." should read --"C"-shaped contact.--